United States Patent [19]

Chen et al.

[11] Patent Number: 5,521,119
[45] Date of Patent: May 28, 1996

[54] POST TREATMENT OF TUNGSTEN ETCHING BACK

[75] Inventors: Shu-Hui Chen; Kuei-Ying Lee; Cheng-Yeh Shih; Wing-Lang Zang, all of Hsin-chu, Taiwan

[73] Assignee: Taiwan Semiconductor Manufacturing Co., Hsinchu, Taiwan

[21] Appl. No.: 274,417

[22] Filed: Jul. 13, 1994

[51] Int. Cl.$^6$ .................................................. H01L 21/44
[52] U.S. Cl. ........................................................ 437/187
[58] Field of Search .................................. 437/187, 192; 156/643, 646, 643.1, 646.1

[56] References Cited

U.S. PATENT DOCUMENTS

| | | |
|---|---|---|
| 4,981,550 | 1/1991 | Huttemann et al. . |
| 5,286,675 | 2/1994 | Chen et al. . |
| 5,332,444 | 7/1994 | George et al. . |
| 5,397,742 | 3/1995 | Kim . |

FOREIGN PATENT DOCUMENTS 60-65533  4/1985  Japan .

OTHER PUBLICATIONS

Horikoshi et al. "Improving EM Lifetime of Alcu/TiN lines and W-Plugs Metal System" Proc. VMIC Conf. Jun. 8–9, 1993 pp. 244–250.

"Improving EM Lifetime of AlCulTiN Lines and W-Plugs Metal System by Controlling Crystal Structure of AlCu", by. H. Horikoshi & T. Nogami, Proceedings of the UMIC Conference, Jun. 8–9, 1993 pp. 244–250.

*Primary Examiner*—George Fourson
*Assistant Examiner*—C. Everhart
*Attorney, Agent, or Firm*—George O. Saile; Rosemary L. S. Pike

[57] ABSTRACT

A new method of metallization without unwanted precipitates using a tungsten plug is achieved. Semiconductor device structures are formed in and on a semiconductor substrate. A contact hole is opened through an insulating layer to the semiconductor substrate. A glue layer is deposited conformally over the surface of the insulating layer and within the contact opening. A layer of tungsten is blanket deposited over the glue layer. The tungsten layer is etched back leaving the tungsten only within the contact opening to form a tungsten plug. The etching back leaves impurities on the surface of the glue layer. Those impurities will react with water or air to form precipitates. The precipitates are removed using a wet chemical etch. The substrate is post treated with argon ion sputtering to prevent future formation of precipitates. A second metal layer is deposited over the tungsten plug and the glue layer to complete the tungsten plug metallization without unwanted precipitates in the fabrication of an integrated circuit.

20 Claims, 2 Drawing Sheets

POST TREATMENT OF TUNGSTEN ETCHING BACK

BACKGROUND OF THE INVENTION (1) Field of the Invention

The invention relates to a method of metallization in the fabrication of integrated circuits, and more particularly, to a method of tungsten metallization which can remove or prevent precipitates after tungsten etchback in the manufacture of integrated circuits.

(2) Description of the Prior Art

A common tungsten plug process is to blanket deposit a tungsten film on a titanium nitride glue layer. The tungsten is etched back with an etch stop at the glue layer. Precipitates are easily formed on the surface of the titanium nitride after tungsten etchback. These precipitates will cause metal hillocks or metal roughness and degrade the reliability of the completed integrated circuit.

In their article, "Improving EM Lifetime of AlCu/TiN Lines and W-Plugs Metal System by Controlling Crystal Structure of AlCu," by H. Horikoshi and T. Nogami, Proceedings of the VMIC Conference, Jun. 8–9, 1993, pp. 244–250, the authors use SF6 and Ar gases to etch back tungsten. This results in the existence of fluorine and sulfur precipitates on the surface of the TiN layer and a roughened TiN surface. They used ammonium hydrogen peroxide to remove the impurities. Alternatively, they used an Argon ion sputtering treatment to remove the damaged portion of the TiN layer. The authors state that they believe the inferior Al alignment is caused not by the roughened surface, but by the existence of the precipitates. No mention is made of preventing future formation of precipitates on the TiN surface after the initial precipitates are removed.

SUMMARY OF THE INVENTION

A principal object of the present invention is to provide an effective and very manufacturable method of metallization without unwanted particles underlying the metal layer in the fabrication of an integrated circuit.

Another object of the invention is to form a tungsten plug with etchback which removes unwanted precipitates.

A further object of the invention is to form a tungsten plug with etchback which prevents the formation of unwanted precipitates.

In accordance with the objects of this invention a new method of metallization without unwanted precipitates using a tungsten plug is achieved. Semiconductor device structures are formed in and on a semiconductor substrate. A contact hole is opened through an insulating layer to the semiconductor substrate. A glue layer is deposited conformally over the surface of the insulating layer and within the contact opening. A layer of tungsten is blanket deposited over the glue layer. The tungsten layer is etched back leaving the tungsten only within the contact opening to form a tungsten plug. The etching back leaves impurities on the surface of the glue layer. Those impurities will react with water or air to form precipitates. The precipitates are removed using a wet chemical etch. The substrate is post treated with argon ion sputtering to prevent future formation of precipitates. A second metal layer is deposited over the tungsten plug and the glue layer to complete the tungsten plug metallization without unwanted precipitates in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
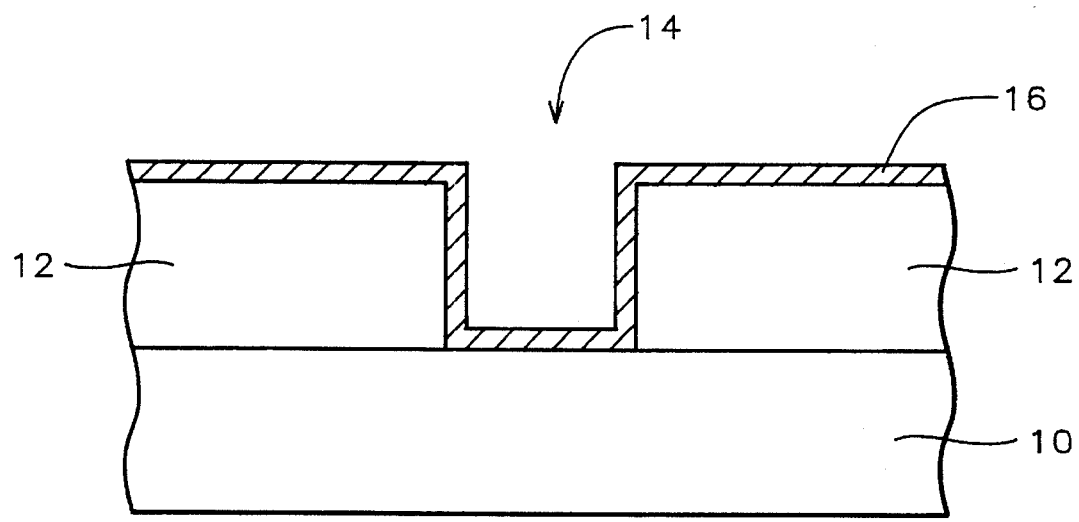
FIGS. 1 through 4 schematically illustrate in cross-sectional representation one preferred embodiment of the present invention.

Referring now more particularly to FIG. 1, there is illustrated a portion of a partially completed integrated circuit. There is shown a semiconductor substrate 10, preferably composed of monocrystalline silicon. Semiconductor device structures such as gate electrodes and source and drain regions and the like, not shown, are fabricated in and on the semiconductor substrate. These semiconductor device structures are presumed to reside within the substrate 10 in FIG. 1. An insulating layer 12, composed of silicon dioxide, borophosphosilicate glass (BPSG), spin-on-glass, or the like, is deposited over the surface of the semiconductor structures to a thickness of between about 5000 to 11,000 Angstroms. A contact hole 14 is opened through the insulating layer to the semiconductor device structure within the substrate 10. This could be, for example, a source/drain region.

A glue layer 16 is deposited conformally over the surface of the insulating layer 12 and within the contact hole 14. The glue layer preferably is composed of titanium nitride, but could be a double layer of titanium nitride overlying titanium, or other materials such as titanium tungsten or titanium tungsten overlying titanium. This glue layer 16 is deposited by reactive sputtering or chemical vapor deposition (CVD) to a thickness of between about 600 to 1200 Angstroms.

Figure 2:
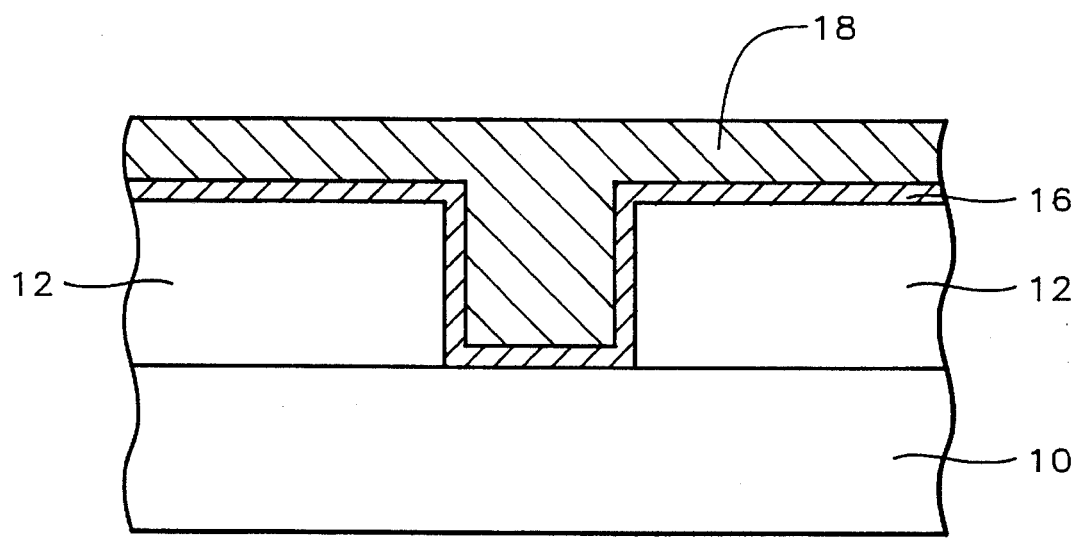
Figure 3:
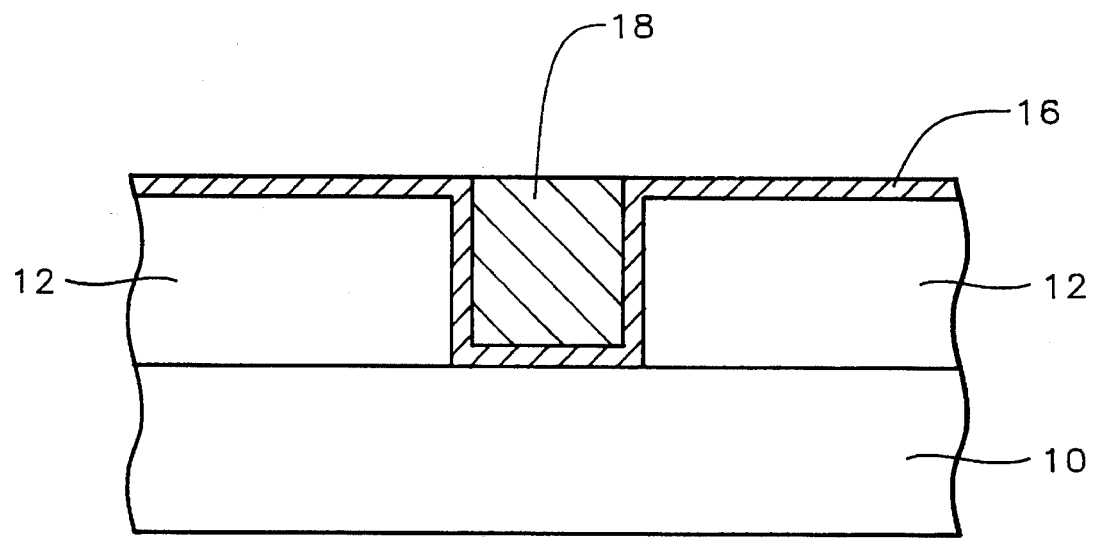

Referring now to FIG. 2, a layer of tungsten 18 is blanket deposited over the substrate by CVD to a thickness of between about 5000 to 10,000 Angstroms. The tungsten is etched back to the horizontal surface of the glue layer, leaving a tungsten plug filling the contact hole, as shown in FIG. 3. The critical etchback conditions are a pressure of between about 200 to 400 mTorr, power of between about 150 to 500 watts and a bottom electrode temperature of between about 20° to 60° C. using $SF_6$ and $N_2$. After etchback, fluorine precipitates form on the surface of the glue layer 16. However, it has been found through experimentation that unlike the prior art, no sulfur precipitates form. It is not known if there is damage to the glue layer, but the electron migration problem resulting from the prior art etching recipe was not seen using the process of the present invention.

The fluorine precipitates are removed by a wet chemical etch. The wafer is dipped in a hydrofluoric acid solution for between about 30 to 60 seconds. Alternatively, the wafer is dipped into a solution of ammonium hydroxide ($NH_4OH$) and hydrogen peroxide ($H_2O_2$) for between about 1 to 3 minutes.

A critical post treatment of the wafer will prevent future formation of precipitates on the wafer surface. The wafer is sputtered with Argon ions at a dosage of between about 5 E 15 to 6 E 15 atoms/$cm^2$, or about $8 \times 10^9$ ions/$cm^3$, and energy of 20 to 30 KeV for between about 30 to 50 seconds. Experiments have shown that without the post treatment, many precipitates appeared on the wafer surface only two hours after etchback and wet chemical removal of precipitates. With the post treatment, no precipitates were found on the wafer surface even 48 hours after etchback and wet chemical removal. Fluorine-rich by-products remain on the titanium nitride surface and will react with the air or humidity to form precipitates. The Argon ion bombardment of the present invention smooths the rough surface of the titanium nitride layer and prevents the trapping of air or humidity on the surface which would induce formation of precipitates.

Figure 4:
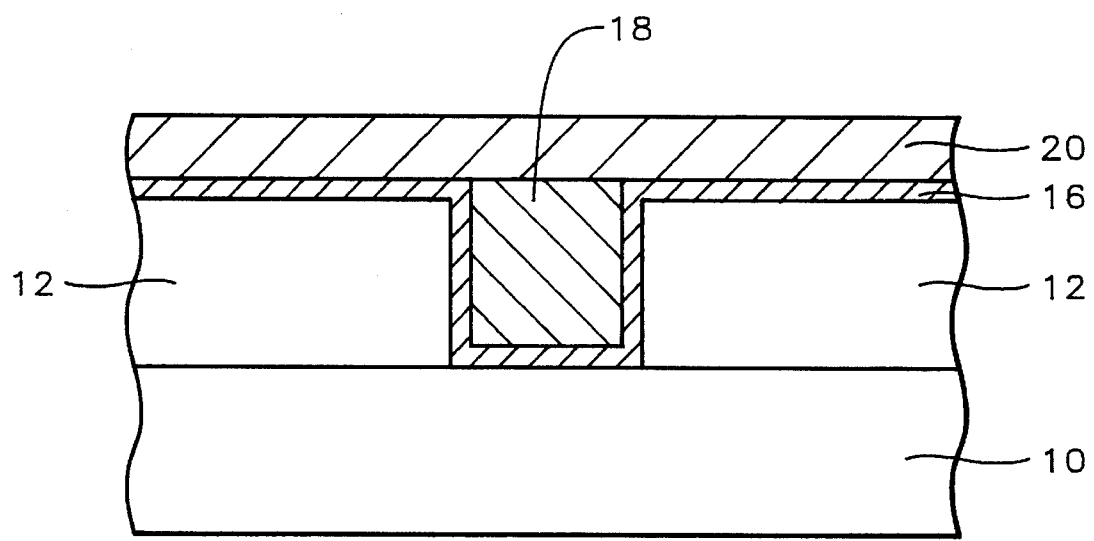

Referring to FIG. 4, the second metallization 20 is deposited and patterned. This metal layer may consist of a layer of AlCu or AlSiCu overlying a TiN, TiN/Ti, Ti/TiN/Ti, TiW/Ti, or Ti/TiW/Ti layer.

While the invention has been particularly shown and described with reference to the preferred embodiments thereof, it will be understood by those skilled in the art that various changes in form and details may be made without departing from the spirit and scope of the invention.

What is claimed is:

1. The method of forming tungsten plug metallization without unwanted precipitates in the fabrication of integrated circuits comprising:

providing semiconductor device structures in and on a semiconductor substrate;

providing an insulating layer covering said semiconductor device structures wherein a contact hole has been opened through said insulating layer to said semiconductor substrate;

depositing a glue layer conformally over the surface of said insulating layer and within said contact opening;

depositing a layer of tungsten over said glue layer;

etching back said tungsten layer leaving said tungsten only within said contact opening to form said tungsten plug wherein said etching back leaves fluorine, but not sulfur precipitates on the surface of said glue layer;

removing said fluorine precipitates with a wet chemical etch;

thereafter post treating said substrate wherein said post treatment prevents future formation of said fluorine precipitates; and depositing a second metal layer over said tungsten plug and said glue layer completing said tungsten plug metallization without unwanted precipitates in the fabrication of said integrated circuit.

2. The method of claim 1 wherein said glue layer is composed of a layer of titanium nitride with a thickness of between about 600 to 1200 Angstroms overlying a layer of titanium with a thickness of between about 400 to 800 Angstroms.

3. The method of claim 1 wherein said glue layer is composed of a layer of titanium nitride with a thickness of between about 600 to 1200 Angstroms.

4. The method of claim 1 wherein said glue layer is composed of a layer of titanium tungsten with a thickness of between about 600 to 1200 Angstroms.

5. The method of claim 1 wherein said glue layer is composed of a layer of titanium tungsten with a thickness of between about 600 to 1200 Angstroms overlying a layer of titanium with a thickness of between about 400 to 800 Angstroms.

6. The method of claim 1 wherein said tungsten layer is etched back using $SF_6$ and $N_2$ with a pressure of between about 200 to 400 mTorr, power of between about 150 to 500 watts and bottom electrode temperature of between about 20° to 60° C.

7. The method of claim 1 wherein said wet chemical etch comprises a hydrofluoric acid solution dip for between about 30 to 60 seconds.

8. The method of claim 1 wherein said wet chemical etch comprises a dip in a solution of $NH_4OH/H_2O_2$ for between about 1 to 3 minutes.

9. The method of claim 1 wherein said post treatment comprises sputtering said substrate with argon ions with a dosage of between about 5 E 15 to 6 E 15 atoms/cm2 and an energy of between about 20 to 30 KeV for between about 30 to 50 seconds.

10. The method of forming tungsten plug metallization without unwanted precipitates in the fabrication of integrated circuits comprising:

providing semiconductor device structures in and on a semiconductor substrate;

providing an insulating layer covering said semiconductor device structures wherein a contact hole has been opened through said insulating layer to said semiconductor substrate;

depositing a glue layer conformally over the surface of said insulating layer and within said contact opening;

depositing a layer of tungsten over said glue layer;

etching back said tungsten layer leaving said tungsten only within said contact opening to form said tungsten plug wherein said etching back leaves fluorine, but not sulfur precipitates on the surface of said glue layer;

removing said fluorine precipitates with a wet chemical etch;

thereafter sputtering said substrate with argon ions wherein said sputtering prevents future formation of said fluorine precipitates; and depositing a second metal layer over said tungsten plug and said glue layer completing said tungsten plug metallization without unwanted precipitates in the fabrication of said integrated circuit.

11. The method of claim 10 wherein said glue layer is composed of a layer of titanium nitride with a thickness of between about 600 to 1200 Angstroms overlying a layer of titanium with a thickness of between about 400 to 800 Angstroms.

12. The method of claim 10 wherein said glue layer is composed of a layer of titanium nitride with a thickness of between about 600 to 1200 Angstroms.

13. The method of claim 10 wherein said glue layer is composed of a layer of titanium tungsten with a thickness of between about 600 to 1200 Angstroms.

14. The method of claim 10 wherein said glue layer is composed of a layer of titanium tungsten with a thickness of between about 600 to 1200 Angstroms overlying a layer of titanium with a thickness of between about 400 to 800 Angstroms.

15. The method of claim 10 wherein said tungsten layer is etched back using $SF_6$ and $N_2$ with a pressure of between about 200 to 400 mTorr, power of between about 150 to 500 watts and bottom electrode temperature of between about 20° to 60° C.

16. The method of claim 10 wherein said wet chemical etch comprises a hydrofluoric acid solution dip for between about 30 to 60 seconds.

17. The method of claim 10 wherein said wet chemical etch comprises a dip in a solution of $NH_4OH/H_2O_2$ for between about 1 to 3 minutes.

18. The method of claim 10 wherein said argon ions are sputtered with a dosage of between about 5 E 15 to 6 E 15 atoms/cm2 and an energy of between about 20 to 30 KeV for between about 30 to 50 seconds.

19. The method of forming tungsten plug metallization without unwanted precipitates in the fabrication of integrated circuits comprising:

provding semiconductor device structures in and on a semiconductor substrate;

providing an insulating layer covering said semiconductor device structures wherein a contact hole has been opened through said insulating layer to said semiconductor substrate;

depositing a glue layer conformally over the surface of said insulating layer and within said contact opening;

depositing a layer of tungsten over said glue layer;

etching back said tungsten layer using $SF_6$ and $N_2$ leaving said tungsten only within said contact opening to form said tungsten plug wherein said etching back leaves fluorine but not sulfur precipitates on the surface of said glue layer;

removing said fluorine precipitates with a wet chemical etch;

thereafter sputtering said substrate with argon ions wherein said sputtering prevents future formation of said fluorine precipitates; and depositing a second metal layer over said tungsten plug and said glue layer completing said tungsten plug metallization without unwanted precipitates in the fabrication of said integrated circuit.

20. The method of claim 19 wherein said argon ions are sputtered with a dosage of between about 5 E 15 to 6 E 15 atoms/cm$^2$ and an energy of between about 20 to 30 KeV for between about 30 to 50 seconds.

* * * * *

UNITED STATES PATENT AND TRADEMARK OFFICE
CERTIFICATE OF CORRECTION

PATENT NO. : 5,521,119
DATED : May 28, 1996
INVENTOR(S) : Shu-Hui Chen, Kuei-Yeng Lee, Cheng-Yeh Shih, Weng-Liang Fang It is certified that error appears in the above-indentified patent and that said Letters Patent is hereby corrected as shown below:

On the title page, item [75]

change "Weng-Liang Zang" to --Weng-Liang Fang--

Signed and Sealed this

Twenty-second Day of October, 1996

Attest:

BRUCE LEHMAN

*Attesting Officer*     *Commissioner of Patents and Trademarks*